(12) United States Patent
Fischer et al.

(10) Patent No.: US 12,453,287 B2
(45) Date of Patent: Oct. 21, 2025

(54) OPTICAL ACTUATOR

(71) Applicants: Gregory Scott Fischer, Boston, MA (US); Paulo Alberto Carvalho, Worcester, MA (US); Zhanyue Zhao, Shrewsbury, MA (US); Christopher Julius Nycz, Wallkill, NY (US)

(72) Inventors: Gregory Scott Fischer, Boston, MA (US); Paulo Alberto Carvalho, Worcester, MA (US); Zhanyue Zhao, Shrewsbury, MA (US); Christopher Julius Nycz, Wallkill, NY (US)

( * ) Notice: Subject to any disclaimer, the term of this patent is extended or adjusted under 35 U.S.C. 154(b) by 992 days.

(21) Appl. No.: 17/616,136

(22) PCT Filed: Jun. 3, 2020

(86) PCT No.: PCT/US2020/035901
§ 371 (c)(1),
(2) Date: Dec. 2, 2021

(87) PCT Pub. No.: WO2020/247481
PCT Pub. Date: Dec. 10, 2020

(65) Prior Publication Data
US 2022/0238786 A1    Jul. 28, 2022

Related U.S. Application Data

(60) Provisional application No. 62/856,599, filed on Jun. 3, 2019.

(51) Int. Cl.
*H02N 2/08* (2006.01)
*H10N 30/50* (2023.01)
(Continued)

(52) U.S. Cl.
CPC .............. *H10N 30/50* (2023.02); *H02N 2/08* (2013.01); *H10N 30/80* (2023.02); *H10N 30/8554* (2023.02)

(58) Field of Classification Search
CPC ....... H10N 30/50; H10N 30/80; H10N 30/584
(Continued)

(56) References Cited

U.S. PATENT DOCUMENTS 5,774,259 A * 6/1998 Saitoh ................. G10K 15/046
359/279
6,392,777 B1    5/2002 Elliott et al.
(Continued)

FOREIGN PATENT DOCUMENTS

CN    107923371    3/2020
JP    5753721    3/1982
(Continued)

OTHER PUBLICATIONS

Fischer, Gregory Scott; Decision of Refusal for Japan Patent Application No. 2021-571907, filed Jun. 3, 2020, mailed Aug. 13, 2024, 7 pgs.
(Continued)

*Primary Examiner* — Derek J Rosenau
(74) *Attorney, Agent, or Firm* — Taylor Duma LLP

(57) ABSTRACT

An actuator (100) powered by photonic energy comprises a rotor including a material (101) which deforms from a first underformed state when exposed to electromagnetic radiation to a second deformed state and begins to return to the first state when the electromagnetic radiation is removed. A stationary element (102) is affixed to the rotor. A moving element (105) engaging the stator at least when the rotor is in the second deformed state. Deformation of the deformable material in response to applied electromagnetic radiation is transmitted by the stator to the moving element by friction
(Continued)

between the stationary element and the moving element for causing motion of the moving element.

20 Claims, 10 Drawing Sheets

(51) Int. Cl.
  *H10N 30/80* (2023.01)
  *H10N 30/853* (2023.01)
(58) Field of Classification Search
  USPC .................................................. 310/300, 311
  See application file for complete search history.

(56) References Cited

U.S. PATENT DOCUMENTS

| | | | |
|---|---|---|---|
| 6,635,818 | B2 | 10/2003 | Ichiki et al. |
| 6,999,221 | B1 * | 2/2006 | Sarkisov ................. G02F 1/295 398/189 |
| 8,648,206 | B2 | 2/2014 | Irie et al. |
| 2008/0004700 | A1 | 1/2008 | Saggere et al. |
| 2009/0062913 | A1 | 3/2009 | Saggere et al. |
| 2009/0246933 | A1 | 10/2009 | Deguet et al. |
| 2010/0066216 | A1 | 3/2010 | Kusumi et al. |
| 2017/0349956 | A1 | 12/2017 | Cho et al. |

FOREIGN PATENT DOCUMENTS

| | | |
|---|---|---|
| JP | H03124975 | 5/1991 |
| JP | H05273367 | 10/1993 |
| JP | 07143779 | 6/1995 |
| JP | 07213077 | 8/1995 |
| JP | 2007166689 | 6/2007 |
| JP | 2009180160 | 8/2009 |
| JP | 5240807 | 7/2013 |
| JP | 2025060697 | 4/2025 |
| WO | 2010/121594 | 10/2010 |
| WO | 2013/188976 | 12/2013 |
| WO | 2017065306 | 4/2017 |
| WO | WO2020247481 | 12/2020 |

OTHER PUBLICATIONS

Fischer, Gregory Scott; International Search Report and Written Opinion for serial No. PCT/US2020/035901, filed Jun. 3, 2020, mailed Nov. 30, 2020, 19 pages.

Dawson, Nathan J, et al., "Modeling the Mechanisms of the Photomechanical Response of a Nematic Liquid Crystal Elastomer", arxiv.org, Cornell University Library, Jun. 17, 2011, 10 pages.

Fischer, Gregory Scott; Notice of Reasons for Refusal for Japan Patent Application No. 2021-571907, filed Jun. 3, 2020, mailed Jan. 9, 2024, 8 pgs.

Fischer, Gregory Scott; Examination Report for Australia Patent Application No. 2020289333, filed Jun. 3, 2020, mailed Feb. 27, 2025, 3 pgs.

Fischer, Gregory Scott, Office Action for China Patent Application No. 202080055047.1, filed Jun. 3, 2020, mailed Mar. 31, 2025, 15 pgs.

Fischer, Gregory Scott, Office Action for Canada Patent Application No. 3140595, filed Jun. 3, 2020, mailed Jun. 4, 2025, 3 pgs.

* cited by examiner

OPTICAL ACTUATOR

GOVERNMENT RIGHTS

This invention was made with government support under NCI Grant# ROI CA166379 awarded by the National Institute for Health. The government has certain rights in the invention.

BACKGROUND

An optical actuator is described and, more particularly, an optical actuator which creates a mechanical movement to do direct work.

Design of an actuator varies by intended use. For example, MRI machines have strong magnetic fields, and MRI-compatible robotics is a growing field. Conventional nonferrous piezoelectric motors can be made MRI compatible, but not MRI Safe. The non-ferrous metals in conventional piezoelectric actuators effects the BO field homogeneity of the MRI leading to distortions and reduced image quality. Pneumatic and hydraulic actuators can be made with no metal components, but this can lead to reduced precision and increased size.

In vacuum environments, traditional motors can be tele-operated and powered by onboard batteries; however, operation time is limited to the life of the batteries. Special seals can be created such that motor cables traverse the vacuum seal, but this adds complexity to the design of the vacuum chamber and poses a source of failure.

For explosive environments, such as fuel tanks in airplanes, motors can be shielded or operate with low voltages that have reduced sparking risk. For example, piezoelectric motors do not arc.

For the foregoing reasons, there is a need for a new actuator with no requirement for electronics or metallic components at or near the point of actuation. The actuator should be MRI Safe and usable as well in vacuum and explosive environments. Ideally, the actuator should be injection moldable or 3D printed.

BRIEF DESCRIPTION OF THE DRAWINGS

For a more complete understanding of the optical actuator, reference should now be had to the embodiments shown in the accompanying drawings and described below. In the drawings.

DESCRIPTION

Certain terminology is used herein for convenience only and is not to be taken as a limiting. For example, words such as "upper," "lower," "left," "right," "horizontal," "vertical," "upward," "downward," "top" and "bottom" merely describe the configurations shown in the FIGS. Indeed, the components may be oriented in any direction and the terminology, therefore, should be understood as encompassing such variations unless specified otherwise. The words "interior" and "exterior" refer to directions toward and away from, respectively, the geometric center of the core and designated parts thereof. The terminology includes the words specifically mentioned above, derivatives thereof and words of similar import.

A photostrictive, or photomechanical, actuator comprises a material which deforms when exposed to light, or other electromagnetic radiation, and partially returns substantially to a first undeformed state when the light is removed under a hysteresis effect. The deformable material could be a layer of lanthanum doped lead zirconium titanate (PLZT). In alternative embodiments, the deformable material may be another material with a light activated strain, including but not limited to lead magnesium niobate-lead titanate (PMN-PT), $BiFeO_3$, and azobenzene-containing liquid-crystalline polymers (LCP's). A single ultraviolet (UV) light source will deform PLZT, PMN-PT and $BiFeO_3$. Controlling the duration of delivery of the light for exposing the material causes desired deformation. Various types of light sources may be used, including across a spectrum (including center wavelength and associated FWHM). Light sources used to control the actuator, or portions thereof, may be pulsed on and off or may be controlled with variable intensity.

Figure 10:
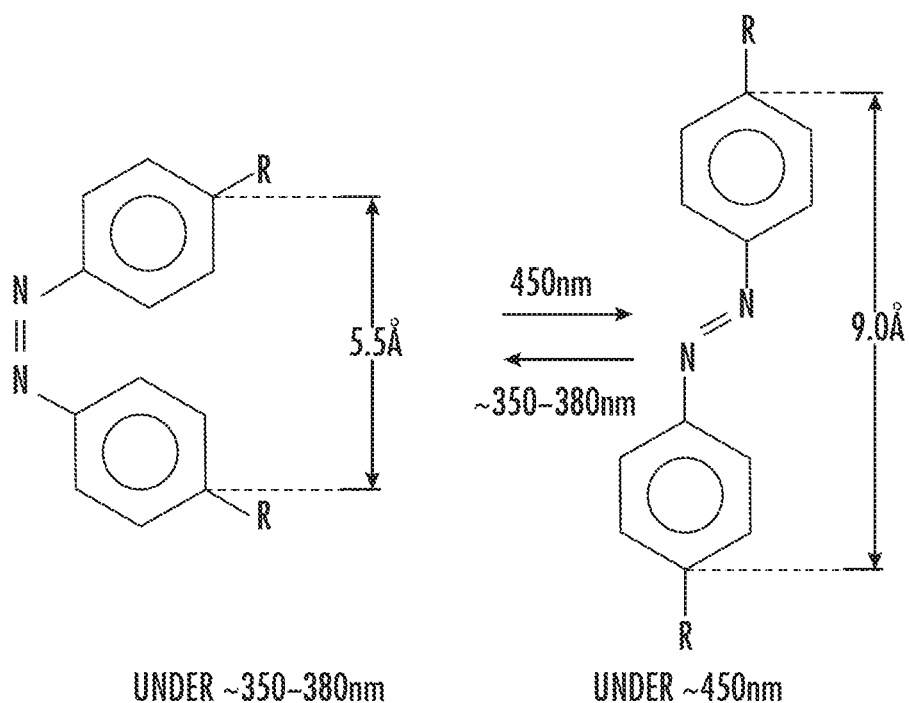
FIG. 10 shows Azobenzene LCPs deforming when exposed to 450 nm wavelength UV light and returning to its undeformed state when exposed to 365 nm wavelength UV light.

In one configuration, (Pb 0.97 La 0.03) (Zr 0.52 Ti 0.48) 1−0.03/4$O_3$, [PLZT (3/52/48)] doped with 0.5% $WO_3$ performs with a photostrictive effect under 366 nm wavelength and 10 mW/$cm^2$ power density UV light source. For example, the response time of PLZT (3/52/48) is typically slow, several seconds up to one minute. As an alternative, PMN-PT-32% has a larger piezoelectric constant and faster response time, about 1 second. $BiFeO_3$ performs with less photostrictive efficiency as compare to optimized PLZT ceramic; however, the $BiFeO_3$ single crystal will be more suitable for certain applications due to a much faster response time, below about 100 µs. Azobenzene LCPs deform when exposed to 450 nm wavelength UV light and returns to the undeformed state when exposed to 365 nm wavelength UV light (FIG. 10). A phase-changing, pulsed light system may be applied to any of the materials. The different materials have different timescales for the contraction and extension, and the appropriate dynamic parameters may be tuned by material selection and preparation, as well as the light source configuration and control. Different materials with different time responses or spectral responses may be combined into a single actuator for control over the motion, and in some embodiments, completely or partially decouple the motion of different portions of the actuator.

Light from a light source may be controlled and the light patterns designed and customized for application to the photostrictive material. In one configuration, a light guide is comprised of one or more optical fiber cables and may output the desired pattern. In one embodiment, light output will be converted to pulsed light output via pulsed light generators with a predetermined pattern. A laser will generate a light output in the spectrum between 300 nm and 10,000 nm. A suitable laser may be selected from lasers including, but not limited to, Ar-ion laser; Nd: YAG lasers; Ti: sapphire lasers; tunable solid state and dye lasers; semiconductor laser; and carbon dioxide lasers. As described above, a control system can be applied to generate variable intensity light output. The desired light output can be spread by an optical system, which is comprising to apparatus generating a light output in the visible or infrared spectrum, and other guides via a lens or another coupler.

Figure 1:
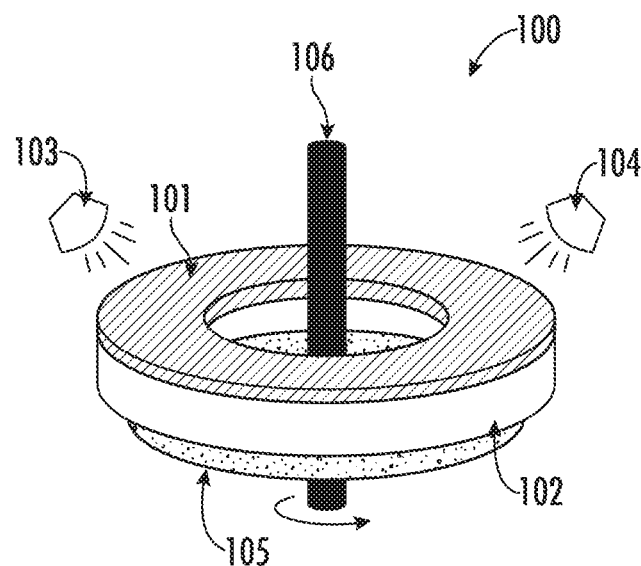
FIG. 1 is a perspective view of an embodiment of an optically actuated photostrictive actuator.

Referring now to the drawings, an embodiment of an embodiment of a photostrictive, or photomechanical, actuator is shown in FIG. 1 and generally designated at 100. The actuator comprises a material 101 which deforms when exposed to light, or other electromagnetic radiation, and partially returns substantially to its first undeformed state when the light is removed under hysteresis effect. In one embodiment, the material 101 may be a discrete component bonded to other layers of the actuator 100, or the material 101 may be directly applied to another material.

The embodiment of the actuator as seen in FIG. 1 further comprises a stator 102. The optically actuated material 101 is bonded to the stator 102, which functions to transmit the deformation of the material 101.

Deformation of the material 101 is induced by one or more optical sources 103, 104 comprising light sources that illuminate the material 101. The light sources 103, 104 may be fully integrated into a fixture such as, but not limited to, LEDs or lasers. The light sources can be disposed in a motor enclosure with the actuator 100. Alternatively, light generators may be remote from the actuator 100 or the site of actuation and optically coupled to the light sources 103, 104, such as through optical fibers or other light guides. In this configuration, one or more lens may be disposed in the body of the motor enclosure.

The stator 102 is frictionally coupled to a moving element 105. Deformation is transmitted by the stator 102 to the moving element 105 which converts deformation transmitted by the stator 102 into motion of the moving element 105.

In one embodiment, the stator 102 has a predetermined periodic pattern of deformation.

In one embodiment, the actuator 100 is a rotary motor. The light-actuated material 101 bonded to the stator 102 deforms when exposed to the light sources 103, 104, resulting in rotation of the moving element 105. The moving element 105 thus functions as a rotor. In this rotary motor embodiment, a form of attachment, such as a rotational shaft 106 or a mounting hole pattern, mechanically couples the motor such that the motion can be used by an external device.

In one application, the material 101 and the stator 102 are fixed in space and the rotor 105 moves relative to the material 101 and the stator 102. This arrangement has the advantage of enabling the light sources 103, 104 to also remain fixed. However, it is understood that the material 101 and the stator 102 may move with respect to rotor 105 which remain as a fixed element.

Figure 2:
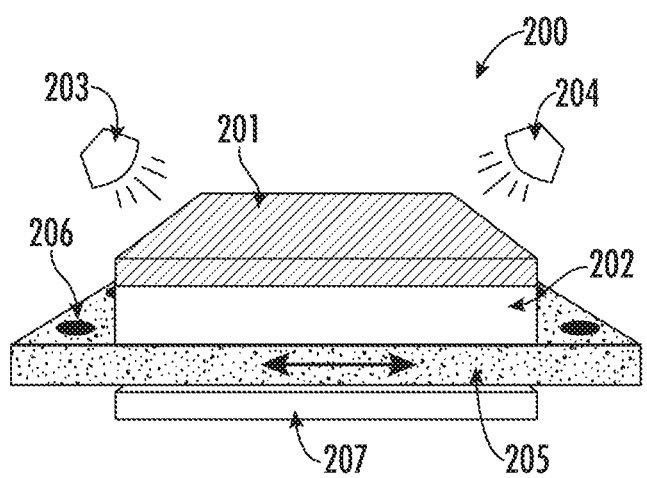
FIG. 2 is a perspective view of another embodiment of a photostrictive actuator.

Another embodiment of a photostrictive actuator is shown in FIG. 2. This embodiment of the actuator comprises a material 201 which deforms when exposed to light or other electromagnetic radiation and returns substantially to its undeformed state when the light is removed. The material 201 is disposed on a stator 202. The stator 202 can be used to generate translational motion along one or more degrees of freedom to an adjacent planar or spherical moving body 205. The moving body 205 may be loaded against the stator 202 via a spring or massive object 207 against gravity. The moving body 205 can be attached via a protrusion, a mounting hole pattern 206, or may be used directly to push or pull another object. It is understood this arrangement does not exclude the scenario wherein the moving body 205 can be part of another object that is being actuated. The arrangement also does not exclude a configuration wherein the moving body 205 can be rotated in addition to, or instead of, translated.

Figure 3:
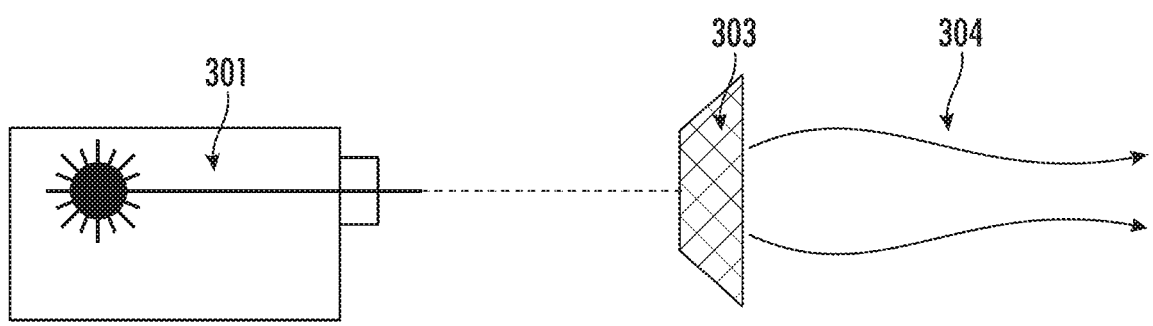
FIG. 3 is a schematic side elevation view of an optical source for use with a photostrictive actuator as shown in FIGS. 1 and 2.
Figure 5:
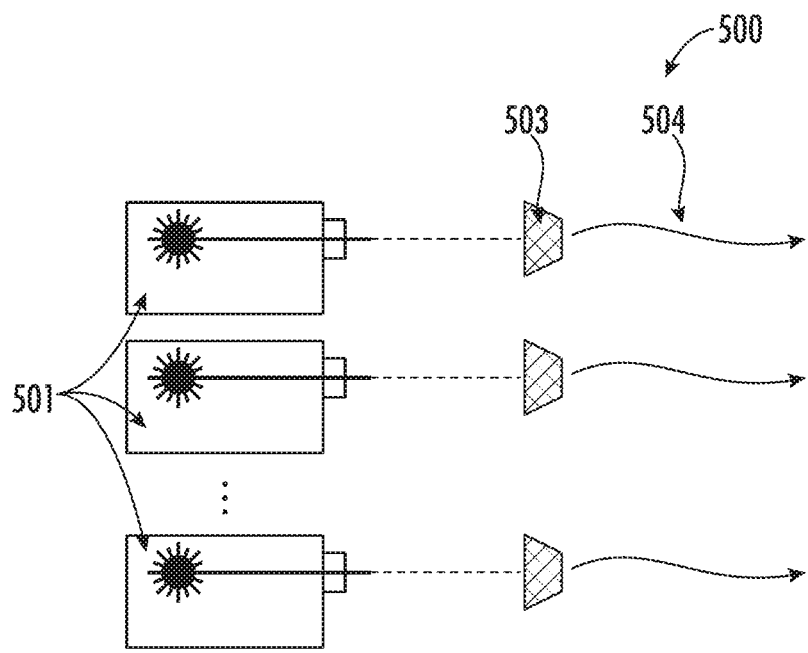
FIG. 5 is a schematic view of a plurality of optical sources for use with a photostrictive actuator as shown in FIGS. 1 and 2.

Referring to FIG. 3, an optical source 301 can be used to produce light or other electromagnetic radiation. The optical source 301 can be coupled to an optical de-multiplexer 303. The de-multiplexer may comprise a beam splitter and acoustic shutters to time or direct produced light or other electromagnetic radiation into a fiber 304 or other guide to the material 101, 201 that deforms when exposed to light. It is understood, however, that the output from the acoustic de-multiplexer 303 may be directly coupled onto a target part. In another embodiment, shown in FIG. 5, multiple optical sources 501 are each coupled 504 via fibers or other guides to a lens 503 or another coupler.

Figure 4:
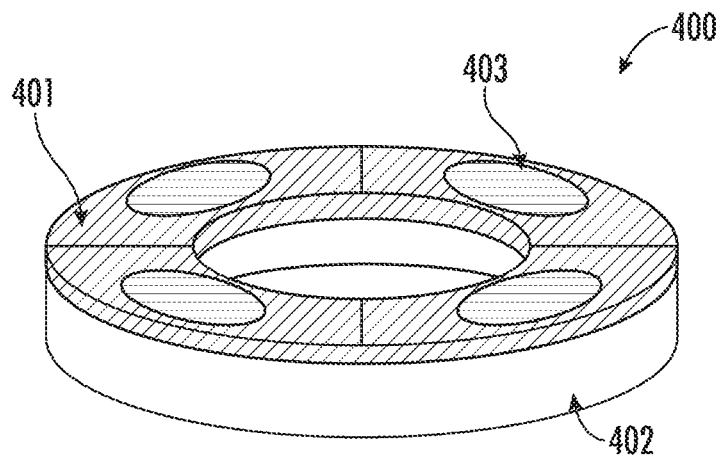
FIG. 4 is a perspective view of an embodiment of a piezoelectric actuator.

A regular piezoelectric actuator 400 (FIG. 4), or equivalent, can be converted into an optical actuator via the addition of photoelectric converters 403. The photoelectric converters 403 can be attached directly to piezoelectric material 401 or another material that has electrically dependent strain characteristics.

Figure 6:
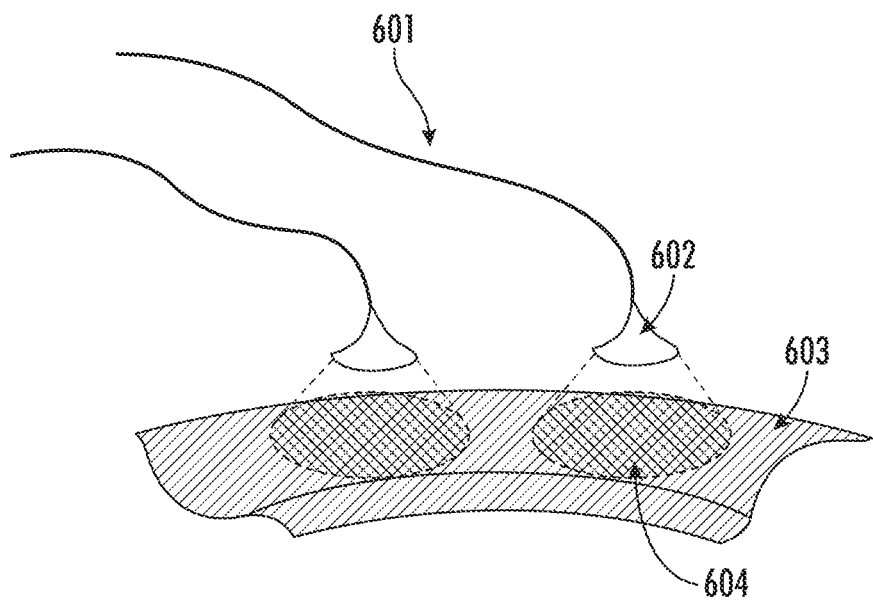
FIG. 6 is a schematic side elevation view of a plurality of movable optical sources for use with a photostrictive actuator as shown in FIGS. 1 and 2.

As shown in FIG. 6, the optical termination 602 can be coupled to or spaced from a material 603 which deforms when exposed to light or other electromagnetic radiation and returns substantially to its undeformed state when the light is removed. It is understood that the optical termination 602 may be movable relative to the material 603.

Figure 7:
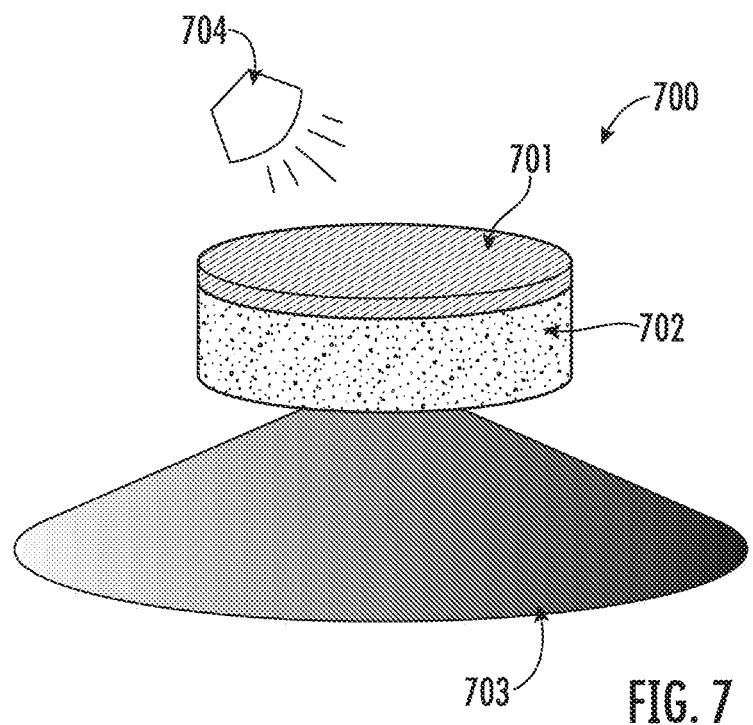
FIG. 7 is an embodiment of a photostrictive actuator for delivering vibration or sound.

An embodiment of an actuator shown in FIG. 7 can be used to create varying pressures in a medium, such as required to produce sound. This embodiment of the actuator comprises a material 701 which deforms when exposed to light or other electromagnetic radiation. This material is bonded to a layer 702 that transfers, couples or amplifies the vibrations onto an element 703 which, in turn, couples or moves the medium. The element 703 can be cone shaped, flat, circular, or other design that is meant to displace the medium within which the element 703 resides. However, it is understood that the actuator may also create pressures in a medium in which the actuator does not completely, or at all, reside.

Figure 8:
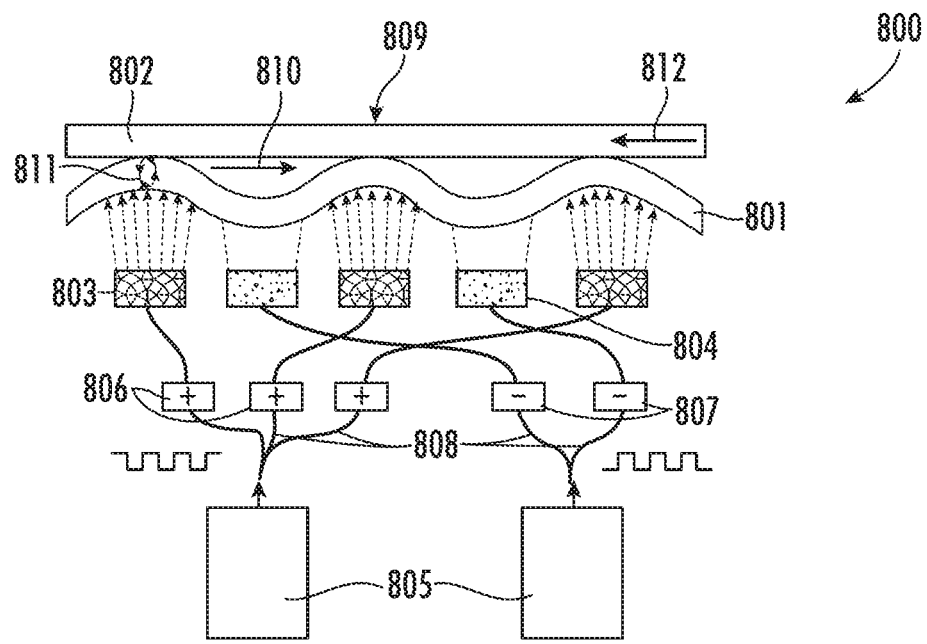
FIG. 8 is a schematic view of another embodiment of a photorestrictive actuator.
Figure 9:
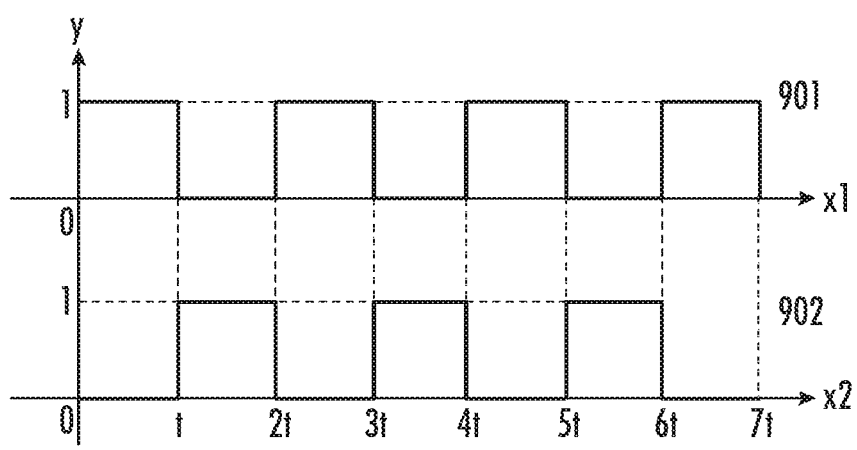
FIG. 9 is a graph showing two patterns of pulsed light output delivered to light generators of the actuator shown in FIG. 8.

Another embodiment of an actuator is shown in FIG. 8 and generally designated at 800. In this embodiment, the actuator 800 comprises a light-actuated material 801, which may be a discrete component bonded to other layers, or may be directly applied to another material acting as stator. A rotor 802 is paired with the surface of the material with high pressure in a direction toward the stator as indicted by an arrow 809 in FIG. 8. A light source 805 generates light output that passes through a light guide 808. In one embodiment, the light guide 808 comprises of one or more optical fibers. In one configuration, the light guide 808 is a multi-mode fiber optic cable. The light output is transferred through via the fiber optic cable 808 to one configuration of the optical system 803, 804 which direct the light output upon the illumination surface of the material 801 and excited the illuminated area. In one embodiment, the light output will be converted to pulsed light output via pulsed light generators 806, 807. As shown in FIG. 9, first pulsed light generators 806 deliver a pattern 901 while second pulsed light generators 807 deliver another pattern 902. With these patterns, the shape of the excited area deforms and generates a traveling wave in a direction indicated by an arrow 810. The traveling wave engages the surface of the rotor 802 at each individual wave peak of the elliptical trajectory 811 where the rotor is frictionally coupled to the material 801 for output generating motion. The direction of movement 812 of the rotor 802 as indicated by an arrow 812 is a direction opposite to the direction 810 which a traveling wave follows.

Figure 11:
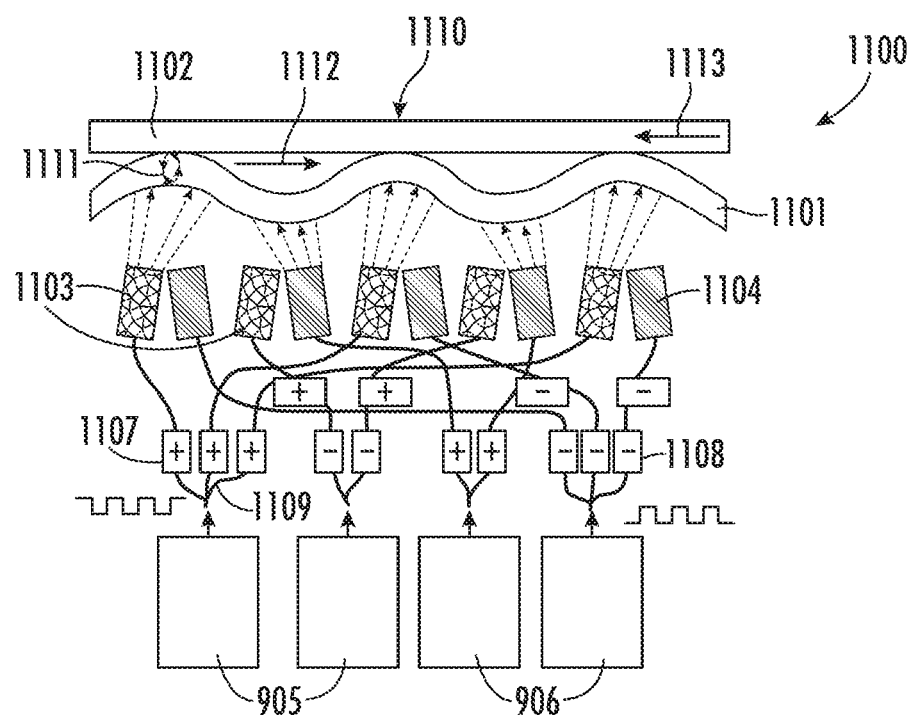
FIG. 11 is a schematic view of another embodiment of a photorestrictive actuator.
Figure 12:
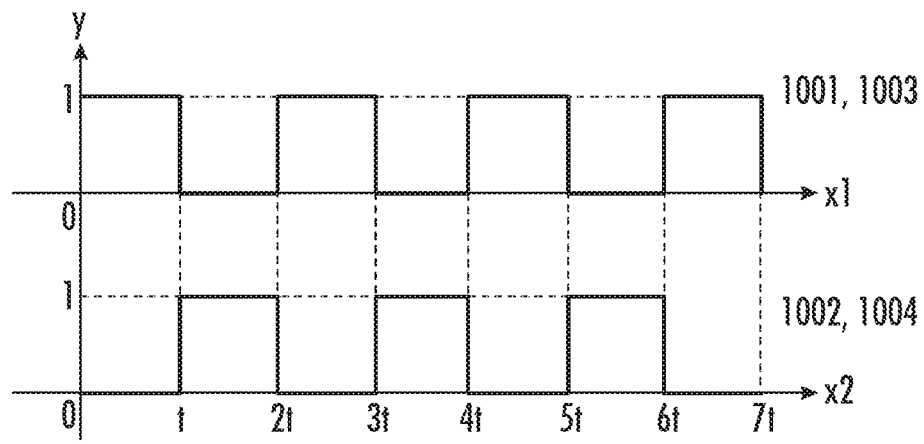
FIG. 12 is a graph showing two patterns of pulsed light output delivered to light generators of the actuator shown in FIG. 11.

In another embodiment shown in FIG. 11, the light actuating material 1101 comprises Azobenzene LCPs. The light actuating material 1101 may be a discrete component bonded to other layers, of the light actuating material 1101 may be directly applied to another material acting as a stator. A rotor 1102 is paired with the surface of stator with high pressure in a direction toward the stator as indicted by an arrow 1110 in FIG. 10. Light sources 905, 906 generate various light output that passes through a light guide 1109. In one embodiment, the light guide 1109 comprises one or more optical fibers. In this configuration, 365 nm wavelength and 450 nm wavelength UV light, respectively, go into multi-mode fiber optic cable 1109. In one embodiment, each light output will be converted to pulsed light output via pulsed light generators 1107, 1108. The pulsed light will follow the patterns shown in FIG. 12. In one configuration, one light output 1107 will have two pulse patterns 1001, 1003 and the other light output 1108 will have another two pulse patterns 1202, 1204.

Light output is transferred via fiber optic cable to two configurations of optical systems 1103, 1104, each designed to direct the light output upon the illumination surface of the material 1101 and excited the illuminated area. The shape of the excited area deforms and generates a traveling wave in a direction indicated by an arrow 1112. The traveling wave engages the surface of the rotor 1102 at each individual wave peak of the elliptical trajectory where the rotor is frictionally coupled to the material 1101 for output generating motion. The direction of movement of the rotor 1102 as indicated by an arrow 1113 is a direction opposite to the direction 1112 which a traveling wave follows. The rotor rotates in a direction indicated by an arrow 1113 opposite to the direction of the traveling wave 1112.

Figure 13:
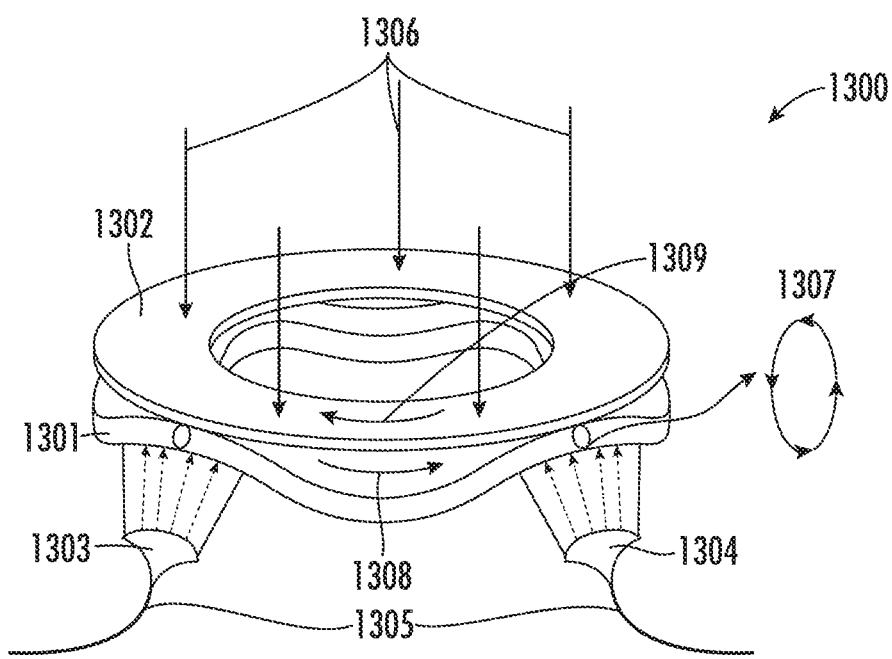
FIG. 13 is a schematic view of an embodiment of a rotary motor.

An embodiment of a rotary motor is shown in FIG. 13 and generally designated at 1300. The rotary motor 1300 comprises a photostrictive material 1301 which functions as a stator. A rotor 1302 is paired with the surface of the stator under high pressure in a direction indicated by an arrow 1306. In one configuration, light output is transferred via optic cables 1305 to one configuration of an optical system 1303, 1304 designed to direct the light output upon the illumination surface of the material 1301. As described above, the light delivered may following an excited pattern. The shape of the excited area of the material deforms and generates a traveling wave in a direction indicated by an arrow 1308. The rotor 1302 engages the stator only at each individual wave peak of the elliptical trajectory where the rotor is frictionally coupled to the material 1301 for output generating motion. The direction of movement 1309 of the rotor 1302 is a direction opposite to the direction which a traveling wave follows as indicated by an arrow 1308. The rotor 1302 rotates in the direction 1309 opposite to the direction of the traveling wave 1308.

Figure 14:
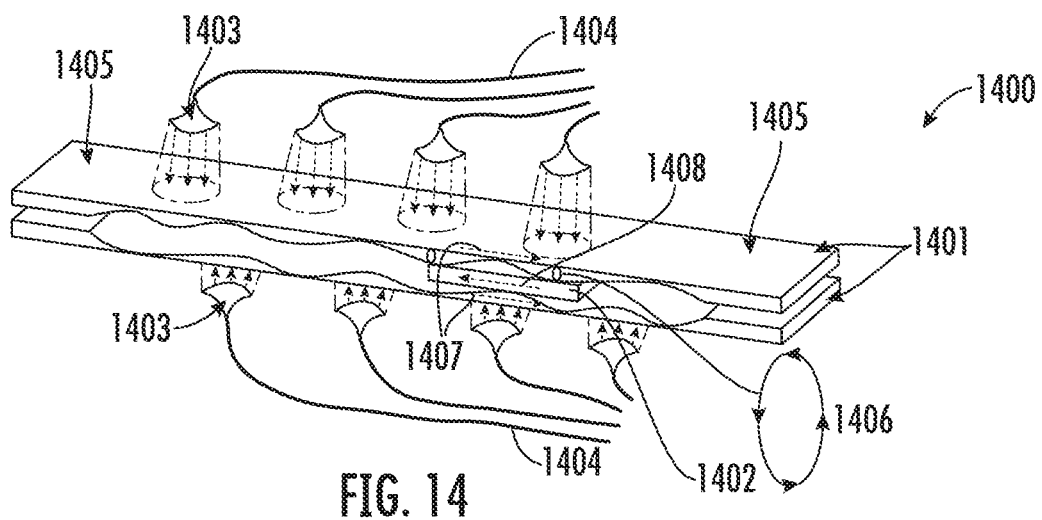
FIG. 14 is a schematic view of an embodiment of a dual surface drive linear motor.

Referring to FIG. 14, an embodiment of a dual surface drive linear motor is shown and generally designated at 1400. The linear motor 1400 comprises a pair of layers of photostrictive material 1401 are acting as stators. A slider 1402 is sandwiched between a top layer and a bottom layer of stators. High pressure is applied across the layers in a direction indicated by an arrow 1405. In one configuration, light output is transferred via optic cables 1404 to an optical array system 1403 designed to direct the light output upon an illumination surface of the material 1401. The light is delivered in a pattern as described above. T shape of the excited area of the material 1401 deforms and generates a traveling wave 1407. The slider 1402 touches the stator only at each wave peak on both top and bottom surfaces. The peaks of the wave carry out orbital of surface particle, for example ellipse trajectory, movement 1407. The direction of movement of this orbital of surface particle 1406 is a direction contrary to the direction of the traveling wave 1407. The slider moves in a direction 1408 opposite to the traveling wave 1407.

Figure 15A:
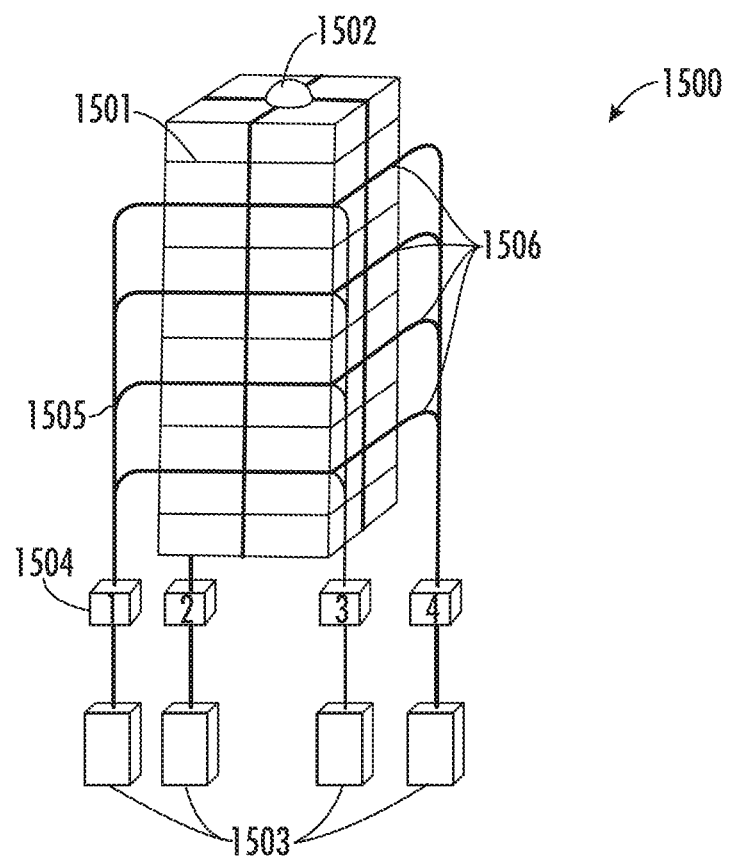
FIGS. 15a and 15b are schematic views of an embodiment of a multi-directional stack motor in a relaxation status and an excited status, respectively.
Figure 15B:
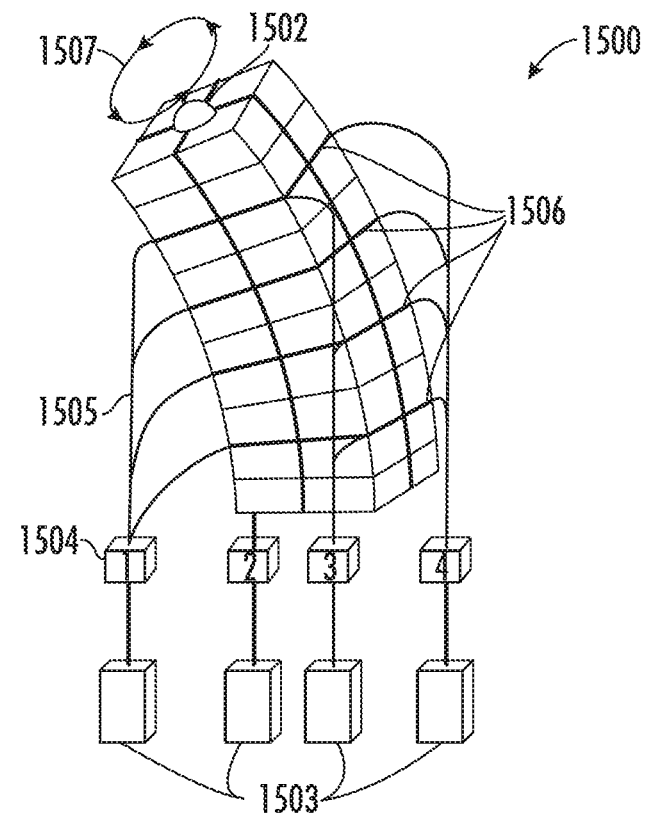
Figure 16:
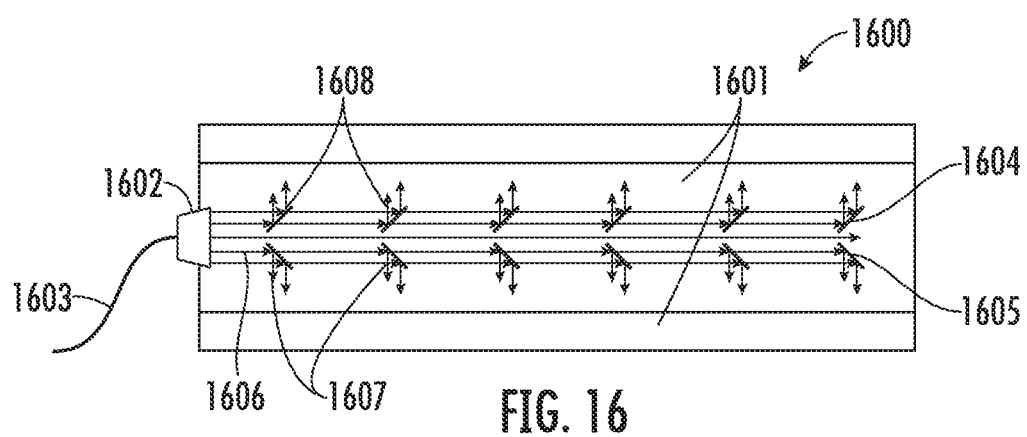
FIG. 16 is a schematic view of light output on an illumination surface of the multi-directional stack motor shown in FIGS. 15a and 15b.
Figure 17:
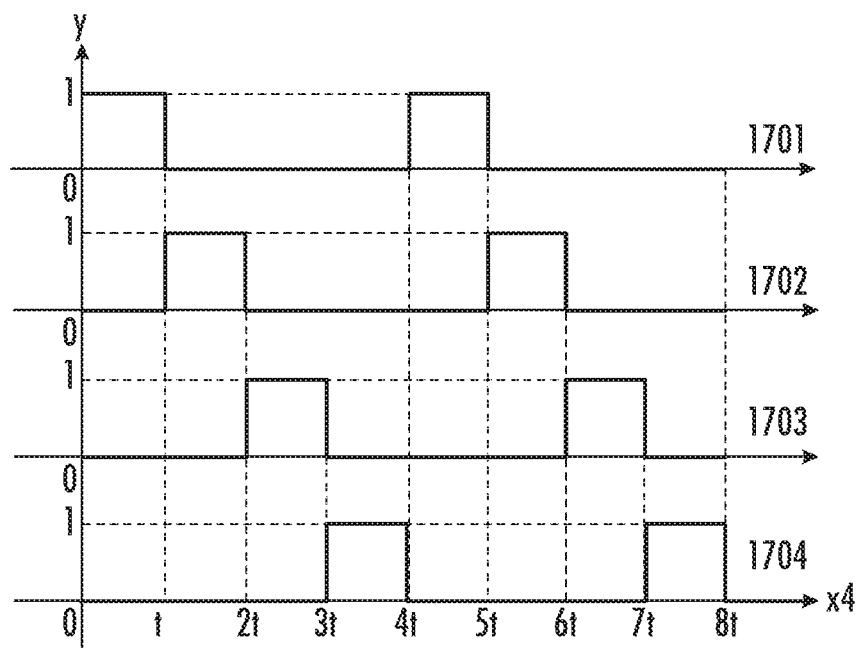
FIG. 17 is a graph showing four patterns of pulsed light output delivered to the multi-directional stack motor shown in FIGS. 15a and 15b.

Referring to FIGS. 15a and 15b, show an embodiment of a multi-directional stack motor generally designated at 1500. In one embodiment, the stack motor 1500 comprises a biomorphic polymeric photostrictive materials stacked together to a desired array structure. In one configuration, a 2×2×5 array of biomorphic material is stacked. An output element 1502 is centrally located on a top surface of the array 1501. A light source 1503 generates light output that passes through a light guide. In one embodiment, light output will be converted to pulsed light output via pulsed light generators 1504 following the example phase shifting patterns 1701-1704 shown in FIG. 17. One light source will follow one pulse pattern 1701. Two light sources will follow a second pulse pattern 1702. Three light sources will follow a third pulse pattern 1703. Four light sources will follow a fourth pulse pattern 1704. Light output is transferred into multi-mode fiber optic cable 1505 and then reflects and spreads upon the illumination surface of the material (FIG. 16). Another embodiment can be fiber sensor connector or fiber terminal connecting and spread method. The output light transfers from fiber optic cable 1603 to one configuration of optical system 1602. In one embodiment, two layers array of 45° reflecting micro mirrors 1607, 1608 are disposed between the two layers of biomorphic polymeric photostrictive material 1601. When the light output 1606 is illuminating, the light is reflected by the micro-mirror array and illuminates the surface of the material 1601. In one configuration, the light output may be passed through the front mirrors to reach the end mirrors. Light power loss and reflecting ratio need to be considered. Under the arrangement shown in FIG. 17, the whole stack array twists around and the output element rotates on a surface parallel to the ground. In another embodiment, the patterns can be different phase shifting setup, for example, 30° phase shifting with overlap causing the output element to rotate on a surface parallel to the ground but in a smaller circle. Alternate switchable working pulse patterns, for example only 1 and 3 output pulse while 2 and 4 output none, the output element rotates on a surface vertical to the ground.

Figure 18:
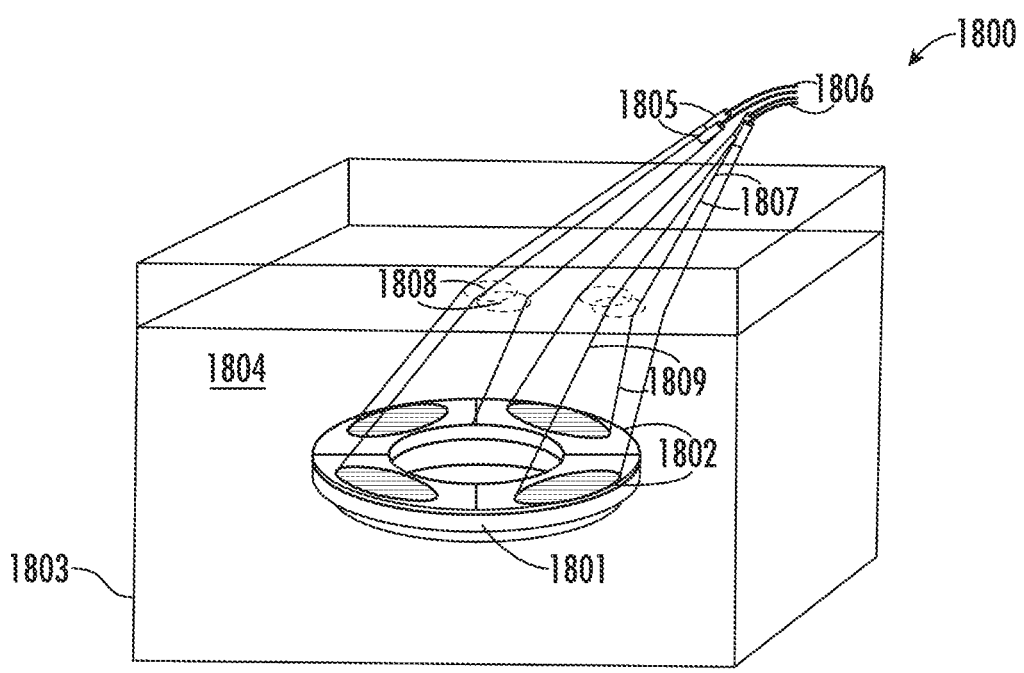
FIG. 18 is a schematic view of an embodiment of an apparatus for use in an underwater environment.

FIG. 18 shows an embodiment of an apparatus under water environment application and is generally designated at 1800. In one embodiment, the apparatus 1800 includes a motor 1801 located in a water tank 1803 and below the water 1804 surface. In one configuration, pulsed light output is transferred via optic cable 1806 to an optical system 1805 designed to direct the light output. The light output 1807 illuminates the water 1808, which light output reflects and, primarily, refracts 1809 a certain angle through water and illuminates upon the surface of the photostrictive material 1802 to excite and deform the material. The light output power loss needs to be carefully considered due to reflection, refraction and passing through water. The location of the actuator 1800 and light output also need to be aligned to transfer the maximum light power density. It is understood that different liquid, as well as multiple layers of liquid, with different refractive indices can be used. The refractive angle needs to be accurate.

Figure 19:
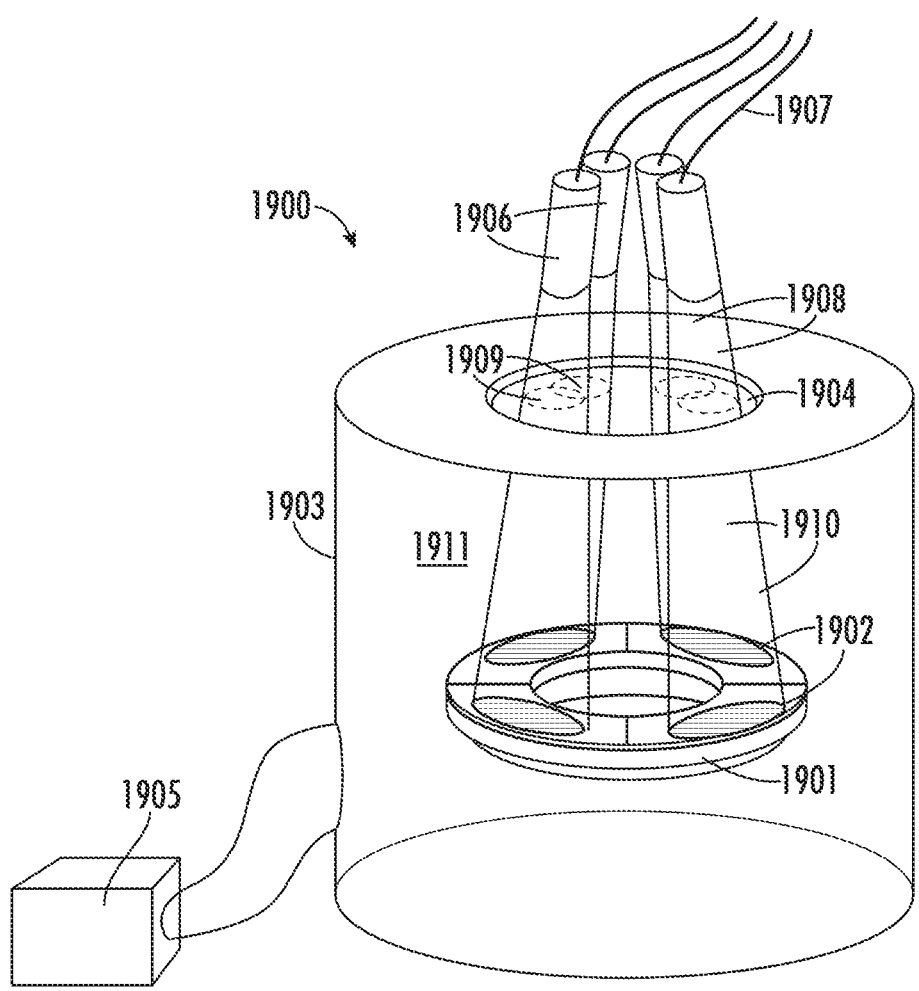
FIG. 19 is a schematic view of an embodiment of an apparatus for use in a vacuum environment.

FIG. 19 shows an embodiment of an apparatus for use in a vacuum chamber environment and is generally designated at 1900. In one embodiment, the apparatus 1900 comprises an actuator 1901 located inside a vacuum chamber 1903. In one configuration, the chamber 1903 has an upper surface including a glass window 1904 or other transparent material with sufficient light absorbance index. An external pump 1905 maintains the vacuum state 1911 within the chamber 1903. In use, pulsed light output is transferred via an optic cable 1907 to an optical system 1906 designed to direct the light output. The light output 1908 illuminates upon the glass at 1909. The light output reflects and mainly passes 1910 through the glass and illuminates the surface of the photostrictive material 1902 to excite and deform. In a configuration, the light output power loss needs to be considered due to transparent material absorbance index. The location of the actuator 1901 and the light output also need to be aligned to transfer the maximum light power density. In another embodiment, a nested vacuum chamber configuration can be also applied. In this configuration the dual transparent material absorbance needs to be considered. In another embodiment, superconducting environment with super low temperature and super high pressure may also applied to this configuration.

The photostrictive actuator as described herein has many advantages, including providing a type of optical motor that is compatible in unique environments, such as MRI machines, vacuum environments, explosive environments, and the like. The actuator can safely operate in the strong magnetic fields of the MRI machine, magnetoencephalogram, or other NMR devices. The actuator can thus achieve the highest interoperability classification of "MRI Safe". In a vacuum environment, the drive signal to the actuator can be passed through a clear window, which is typically available in vacuum chambers. An optical coupling allows the motor to be actuated without a wire breaching the vacuum seal. This may also apply to underwater applications. The actuator can operate without battery life restrictions. The actuator operates without any electronics in an explosive environment, which removes the risk associated with sparking of the motor.

The actuator will also work in other highly sensitive environments, such as for instrumentation, where electronics must be removed from the actuator to minimize chances for interference. This could be applicable to scientific instrumentation for terrestrial labs as well as space applications. Moreover, the optical "back end" of the motor may be a large, intricate device. However, at the point of actuation, the optical back end could be coupled to a very low cost piezo crystal (essentially just a ceramic disc) without necessarily needing physical contact (i.e. across a sterile boundary). This arrangement could be ideal for actuated modules in a single-use sterilized surgical kit. Micro-actuation techniques may be possible by placing an optical unit remotely and a highly focused small optical fiber or light guide at the actuator.

If made into a vibration device or a speaker, the resonant motor may operate as an underwater ultrasonic module when made from parts that do not corrode and as there are no wires losing their conductivity in ionic environments. In an aerospace application, an optical coupling allows the motor to be actuated without a wire control setup, for example, for use as rolling a reaction wheel in Hubble Space Telescope turning angles. Other more direct solutions are possible without the need for tangential solutions, such as battery, shielding, etc., as in the aforementioned industries.

Although the optical actuator has been shown and described in considerable detail with respect to only a few exemplary embodiments thereof, it should be understood by those skilled in the art that we do not intend to limit ourselves to the embodiments since various modifications, omissions and additions may be made to the disclosed embodiments without materially departing from the novel teachings and advantages of the apparatus, particularly in light of the foregoing teachings. Accordingly, we intend to cover all such modifications, omission, additions and equivalents as may be included within the spirit and scope of the apparatus, system and method as defined by the following claims. In the claims, means-plus-function clauses are intended to sticker the structures described herein as performing the recited function and not only structural equivalents but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

We claim:

1. An actuator powered by photonic energy, the actuator comprising:
   a body comprising a material which deforms from a first undeformed state when exposed to electromagnetic radiation to a second deformed state and begins to return to the first state when the electromagnetic radiation is removed;
   an optical de-multiplexer;
   a source of electromagnetic radiation adapted to generate an output, the electromagnetic radiation source coupled to the de-multiplexer and disposed for irradiating the surface of the body with the output;
   a stationary element affixed to the body; and a moving element engaging the stationary element at least when the body is in the second deformed state, wherein deformation of the deformable material in response to applied electromagnetic radiation is transmitted by the stationary element to the moving element by friction between the stationary element and the moving element for causing motion of the moving element.

2. An actuator as recited in claim 1, wherein the deformable material is selected from lanthanum doped lead zirconium titanate (PLZT), lead magnesium niobate-lead titanate (PMN-PT), $BiFeO_3$, and azobenzene-containing liquid-crystalline polymers (LCP's).

3. An actuator as recited in claim 1, wherein the deformation comprises an elastic bulk dimensional change in the deformable material of the body.

4. An actuator as recited in claim 1, further comprising an optical guide for optically coupling the electromagnetic radiation source to the deformable material.

5. An actuator as recited in claim 4, wherein the optical guide is an optical fiber.

6. An actuator as recited in claim 3, wherein the electromagnetic radiation source is a light source for generating an output.

7. An actuator as recited in claim 6, wherein the light source comprises a light shaping optical device adapted to focus the light output.

8. An actuator as recited in claim 7, wherein the light shaping optical device comprises an optical lens.

9. An actuator as recited in claim 6, wherein the light source is adapted to generate a pulsed light output.

10. An actuator as recited in claim 6, wherein the light source comprises a laser.

11. An actuator as recited in claim 1, further comprising a spring or massive object against gravity for loading the moving element against the stationary element.

12. An actuator as recited in claim 1, wherein the motion is rotary, and the moving element comprises a rotor, and further comprising a rotatable output shaft coupled to the rotor.

13. An actuator as recited in claim 1, wherein the motion is translational along one or more degrees of freedom.

14. An actuator as recited in claim 1, further comprising an object operatively connected for motion with the moving element.

15. An actuator as recited in claim 1, wherein the optical de-multiplexer is a beam splitter adapted to split output transferred from an electromagnetic radiation source for transfer to a plurality of surfaces on the body.

16. An optical actuator as recited in claim 12, wherein the stationary element is a shape selected from a cone, planar, a circular plane.

17. An actuator as recited in claim 1, wherein the output from the electromagnetic radiation source is controlled in a coordinated manner such that periodic deformation is generated in the body to enable a continuous motion of the moving element.

18. An actuator as recited in claim 17, wherein the continuous motion generated is a rotary motion.

19. An actuator as recited in claim 17, wherein the continuous motion generated is a linear motion.

20. An actuator as recited in claim 9, wherein the pulsed light output causes reciprocating deformation of the body.

* * * * *